United States Patent [19]
Kim et al.

[11] Patent Number: 6,037,269
[45] Date of Patent: Mar. 14, 2000

[54] ETCHING METHODS OF SILICON NITRIDE FILMS EMPLOYED IN MICROELECTRONIC DEVICES

[75] Inventors: Eun-a Kim; Sang-o Park, both of Kyungki-do, Rep. of Korea

[73] Assignee: Samsung Electronics Co., Ltd., Rep. of Korea

[21] Appl. No.: 09/392,053

[22] Filed: Sep. 8, 1999

Related U.S. Application Data

[62] Division of application No. 09/048,070, Mar. 25, 1998.

[30] Foreign Application Priority Data

Mar. 31, 1997 [KR] Rep. of Korea ............... 97-11899

[51] Int. Cl.$^7$ .................................................. H01L 21/00
[52] U.S. Cl. ..................... 438/745; 438/757; 252/79.1; 252/79.2
[58] Field of Search ..................................... 438/745, 757

[56] References Cited

U.S. PATENT DOCUMENTS

| | | | |
|---|---|---|---|
| 3,867,272 | 2/1975 | Rust et al. | 204/194 |
| 3,923,562 | 12/1975 | Dhanka | 438/372 |
| 5,472,562 | 12/1995 | Ziger | 156/657.1 |

FOREIGN PATENT DOCUMENTS

| | | |
|---|---|---|
| 2321013 | 4/1973 | Denmark . |
| 2177554 | 3/1972 | France . |

*Primary Examiner*—Benjamin L. Utech
*Assistant Examiner*—Lynette T. Umez-Eronini
*Attorney, Agent, or Firm*—Myers Bigel Sibley & Sajovec, P.A.

[57] ABSTRACT

Aqueous compositions for etching silicon nitride films present on wafers used in microelectronic devices comprise hydrogen fluoride and phosphate. Methods for etching silicon nitride films present in wafers to be used in microelectronic devices comprise exposing the wafers to the aqueous compositions.

8 Claims, No Drawings

ETCHING METHODS OF SILICON NITRIDE FILMS EMPLOYED IN MICROELECTRONIC DEVICES

CROSS-REFERENCE TO RELATED APPLICATIONS

The instant application is a divisional application of Ser. No. 09/048,070, filed Mar. 25, 1998, pending the disclosure of which is incorporated herein by reference in its entirety.

FIELD OF THE INVENTION

The invention generally relates to compositions for etching films used in microelectronic devices and methods of using the same.

BACKGROUND OF THE INVENTION

Films formed from silicon nitride ($Si_3N_4$) are becoming more widely used in conjunction with microelectronic devices such as wafers employed in integrated circuit devices. The silicon nitride may be used as an insulating film, a dielectric film, or a passivation film on the wafer. Silicon nitride is perceived to be desirable since it is capable of exhibiting good physical and chemical stability. There may be an increased demand for highly integrated circuits. These circuits may require reduced film thicknesses, improved film quality, increased dielectric levels, and increased mechanical strength. Additionally, it would be desirable if films used in the highly integrated circuits provide adequate vapor barrier and sodium barrier properties. The use of silicon nitride may be desirable for use in films which are capable of displaying these improved properties.

Utilization of silicon nitride, however, may present difficulties. Because silicon nitride often exhibits a high level of stabilization, it may be difficult to etch. In particular, it is often difficult to form a silicon nitride film at a temperature less than 450° C. and then etch the film at a high resolution. Conventionally, a wafer comprising a silicon nitride film thereon is dipped into an etching chamber containing phosphoric acid ($H_3PO_4$), and then the etching chamber is heated to a temperature ranging from 150° C. to about 170° C. to thereby etch the silicon nitride film. This etching process may be disadvantageous in that the etching rate is often slow, for example 50 Å/min. As a result, the production rate of integrated circuit devices using films etched by this process may be adversely affected. Moreover, the etching apparatus may become damaged as a result of the above procedure.

More recently, attempts have been made at etching silicon nitride films using an oxide film etch mask method or a plasma etching method in trying to obtain higher etch resolutions. The oxide film mask method attempts to improve the etching resolution by using hydrogen fluoride (HF) wet etching technology. Notwithstanding any potential advantages, the oxide film mask method is often complicated from a processing standpoint due to the use of a mask, and also because of the slow etching rate. A plasma etching method typically involves the ionization of etching gas, and the chemical or physical removal of the gas by the acceleration of the gas on the wafer surface. Equipment costs for carrying out this method, however, are typically high since largescale, complicated equipment is typically used. Moreover, a high level of power is usually required to carry out the plasma etching method.

There is a need in the art for etching compositions and methods of using the same which are more efficient than conventional methods in terms of equipment cost. There is also a need in the art for etching compositions and methods of using the same which can provide faster etching rates than realized using conventional etching solutions.

SUMMARY OF THE INVENTION

It is an object of the present invention to provide etching compositions and methods of using the same which can be more efficient than conventional compositions and methods thereof in terms of equipment cost.

It is another object of the invention to provide etching compositions and methods of using the same which can provide faster etching rates than are typically experienced when using conventional cleaning solutions.

To these ends and others, in one aspect the invention provides aqueous compositions for etching silicon nitride films present in wafers employed in microelectronic devices. The compositions comprise hydrogen fluoride and at least one phosphate.

In another aspect, the invention provides methods for etching silicon nitride films which are present in microelectronic devices such as wafers employed in microelectronic devices. The methods comprise exposing the wafers to aqueous compositions comprising hydrogen fluoride and at least one phosphate.

DETAILED DESCRIPTION OF THE PREFERRED EMBODIMENTS

The present invention now will be described more fully hereinafter with reference to the accompanying disclosure and example in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In one aspect, the invention relates to aqueous compositions for etching silicon nitride films present on microelectronic devices such as wafers employed in integrated circuit (e.g., semiconductor) devices. The aqueous compositions comprise hydrogen fluoride and at least one phosphate.

Preferably, the aqueous compositions comprise from about 10 to about 90 percent by weight of hydrogen fluoride and from about 90 to about 10 percent by weight of the at least one phosphate. More preferably, the compositions comprise from about 50 to about 80 percent by weight of hydrogen fluoride and from about 20 to about 50 percent by weight of the at least one phosphate.

Although not wishing to be bound by any one theory, it is believed that the etching rate varies according to the relative amounts of hydrogen fluoride and phosphate which are employed in the compositions of the invention. To illustrate further, the etching rate has been observed to be inversely proportional to the amount of hydrogen fluoride which is used until the weight percent of phosphate reaches 10 weight percent. As the amount of phosphate exceeds 10 weight percent, the etching rate is believed to vary proportionally to the amount of hydrogen fluoride which is used. More particularly, the etching rate may be from about 800 Å/min to about 1,800 Å/min. When the compositions comprise from about 50 to about 80 percent by weight of hydrogen fluoride and from about 20 to about 50 percent by weight of phosphate, the etching rate may range from about 1,500 Å/min to about 2,000 Å/min.

The hydrogen fluoride used in the compositions of the invention is known to one in the art, and can be similar to the material which is used in etching conventional oxide films.

Preferably, the phosphates are neutral salts of tribasic acids. For example, the neutral salts may include inorganic cations, organic cations, or mixtures thereof. Examples of inorganic cations include, but are not limited to, alkali metals and alkaline earth metals. An example of an organic cation includes, but is not limited to, ammonium. Phosphate of ammonium is preferably employed since little or no resisual amounts of composition are typically present after etching. This may be desirable since the presence of post-etching materials on the wafers can adversely impact integrated circuit device electrical properties.

As an example, the neutral salts of tribasic acids may be expressed by the following formulae: $M^1{}_2HPO_4$; $M^1{}_1H_2PO_4$; and $M^2{}_1HPO_4$ wherein $M^1$ may be an alkali metal such as lithium, sodium, or potassium and $M^2$ may be an alkali earth metal such as beryllium, magnesium, and calcium.

In another aspect, the invention relates to methods for etching silicon nitride films which are present on microelectronic devices such as wafers to be employed in integrated circuit devices. The methods comprise exposing the devices to the compositions described herein.

The methods of the invention are preferably carried out by dipping the devices into conventional etching chambers having the aqueous compositions contained therein. The compositions are then typically heated such that the compositions evaporate. The devices are then contacted by the gaseous phase (i.e., vapors) which result from the evaporation of the compositions. Accordingly, the silicon nitride films may be etched at a higher rate than previously realized.

The compositions are preferably heated to temperatures from about 40° C. to about 100° C. If the temperatures are lower than 40° C., a decrease in the etching rate may be experienced. If the temperatures are higher than about 100° C., the equipment used during etching (including the etching chamber itself) could become damaged.

The invention may be desirable in that faster rates of etching silicon nitride are possible relative to conventional etching solutions and methods of using the same. Moreover, equipment costs involved may be lower relative to costs associated with conventional etching techniques.

The invention will now be described in greater detail with reference to the example which follows. It should be understood that the example is set forth only to illustrate the invention, and is not meant as a limitation thereof.

EXAMPLE

Hydrogen fluoride and phosphate are mixed together to form an etching composition. The etching composition is placed into an etching chamber containing a wafer having silicon nitride films thereon. The etching chamber is then heated to a temperature of 70° C. In sequence, the wafer is contacted with the vapor eminating from the heated etching composition and the silicon nitride film is etched off of the wafer.

In the specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method for etching a silicon nitride film present on a microelectronic device, said method comprising exposing the device to an aqueous composition comprising hydrogen fluoride and at least one phosphate, wherein the at least one phosphate is a neutral salt of a tribasic acid comprises an organic cationic ion, and wherein the organic cationic ion is ammonium.

2. A method according to claim 1, wherein said exposing step is carried out at a temperature ranging from about 40° C. to about 100° C.

3. A method according to claim 1, wherein the aqueous composition comprises from about 10 to about 90 percent by weight of hydrogen fluoride and from about 90 to about 10 percent by weight of the at least one phosphate.

4. A method according to claim 1, wherein the aqueous composition comprises from about 50 to about 80 percent by weight of hydrogen fluoride and from about 20 to about 50 percent by weight of the at least one phosphate.

5. A method according to claim 1, wherein the at least one phosphate is a neutral salt of a tribasic acid.

6. A method according to claim 5, wherein the neutral salt of a tribasic acid comprises an inorganic cationic ion selected from the group consisting of an alkali metal, an alkali earth metal, and mixtures thereof.

7. A method according to claim 1, wherein said step of exposing the wafer with the composition comprises contacting the wafer with a gaseous phase resulting from the evaporation of the aqueous composition.

8. A method according to claim 1, further comprising the steps of dipping the microelectronic device into an etching chamber having the aqueous composition present therein; and heating the aqueous composition such that the composition evaporates; and wherein said step of exposing the wafer with the composition comprises contacting the wafer with a gaseous phase resulting from the evaporation of the aqueous composition.

* * * * *